United States Patent
Kumar et al.

(10) Patent No.: US 12,528,151 B2
(45) Date of Patent: *Jan. 20, 2026

(54) GAS ENTRAINMENT DURING JETTING OF FLUID FOR TEMPERATURE CONTROL IN CHEMICAL MECHANICAL POLISHING

(71) Applicant: Applied Materials, Inc., Santa Clara, CA (US)

(72) Inventors: Surajit Kumar, San Jose, CA (US); Hui Chen, San Jose, CA (US); Chih Chung Chou, San Jose, CA (US); Shou-Sung Chang, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 398 days.

This patent is subject to a terminal disclaimer.

(21) Appl. No.: 18/107,220

(22) Filed: Feb. 8, 2023

(65) Prior Publication Data
US 2023/0182259 A1 Jun. 15, 2023

Related U.S. Application Data

(63) Continuation of application No. 16/932,615, filed on Jul. 17, 2020, now Pat. No. 11,577,358.
(Continued)

(51) Int. Cl.
*B24B 37/015* (2012.01)
*B24B 37/34* (2012.01)
(Continued)

(52) U.S. Cl.
CPC ............ *B24B 37/015* (2013.01); *B24B 37/34* (2013.01); *B24B 49/14* (2013.01); *B24B 53/095* (2013.01);
(Continued)

(58) Field of Classification Search
CPC ..... B24B 37/015; B24B 37/042; B24B 57/02; B24B 49/14; B24B 55/02; B24B 55/03; B24B 53/095
(Continued)

(56) References Cited

U.S. PATENT DOCUMENTS

| | | | |
|---|---|---|---|
| 4,450,652 | A | 5/1984 | Walsh |
| 5,088,242 | A | 2/1992 | Lubbering et al. |

(Continued)

FOREIGN PATENT DOCUMENTS

| | | |
|---|---|---|
| CN | 101143636 | 3/2008 |
| CN | 101885163 | 11/2010 |

(Continued)

OTHER PUBLICATIONS

Extended European Search Report in European Appln. No. 21831640.4, dated Jul. 3, 2024, 9 pages.
(Continued)

*Primary Examiner* — Makena S Markman
(74) *Attorney, Agent, or Firm* — Fish & Richardson P.C.

(57) ABSTRACT

A chemical mechanical polishing system includes a platen to support a polishing pad having a polishing surface, and a pad cooling assembly. The pad cooling assembly has an arm extending over the platen, a nozzle suspended by the arm and coupled to a source of coolant fluid, the nozzle positioned to spray coolant fluid from the source onto the polishing surface of the polishing pad, and an opening in the arm adjacent the nozzle and a passage extending in the arm from the opening, the opening positioned sufficiently close to the nozzle that a flow of coolant fluid from the nozzle entrains air from the opening.

20 Claims, 6 Drawing Sheets

Related U.S. Application Data (60) Provisional application No. 63/046,414, filed on Jun. 30, 2020.

(51) Int. Cl.

| | |
|---|---|
| *B24B 49/14* | (2006.01) |
| *B24B 53/095* | (2006.01) |
| *B24B 55/02* | (2006.01) |
| *B24B 55/03* | (2006.01) |
| *B24B 57/02* | (2006.01) |

(52) U.S. Cl.
CPC .............. *B24B 55/02* (2013.01); *B24B 55/03* (2013.01); *B24B 57/02* (2013.01)

(58) Field of Classification Search
USPC .................................................. 451/5, 7, 53
See application file for complete search history.

(56) References Cited

U.S. PATENT DOCUMENTS

| | | | |
|---|---|---|---|
| 5,196,353 | A | 3/1993 | Sandhu et al. |
| 5,597,442 | A | 1/1997 | Chen et al. |
| 5,643,050 | A | 7/1997 | Chen |
| 5,709,593 | A | 1/1998 | Guthrie |
| 5,722,875 | A | 3/1998 | Iwashita et al. |
| 5,738,574 | A | 4/1998 | Tolles et al. |
| 5,762,544 | A | 6/1998 | Zuniga et al. |
| 5,765,394 | A | 6/1998 | Rhoades |
| 5,851,135 | A | 12/1998 | Sandhu et al. |
| 5,851,846 | A | 12/1998 | Matsui et al. |
| 5,868,003 | A | 2/1999 | Simas et al. |
| 5,873,769 | A | 2/1999 | Chiou et al. |
| 5,957,750 | A | 9/1999 | Brunelli |
| 6,000,997 | A | 12/1999 | Kao et al. |
| 6,012,967 | A | 1/2000 | Satake et al. |
| 6,023,941 | A | 2/2000 | Rhoades |
| 6,095,898 | A | 8/2000 | Hennofer et al. |
| 6,121,144 | A | 9/2000 | Marcyk et al. |
| 6,139,406 | A | 10/2000 | Kennedy et al. |
| 6,151,913 | A | 11/2000 | Lewis et al. |
| 6,155,818 | A | 12/2000 | Joshi et al. |
| 6,159,073 | A | 12/2000 | Wiswesser et al. |
| 6,257,954 | B1 | 7/2001 | Ng et al. |
| 6,257,955 | B1 | 7/2001 | Springer et al. |
| 6,264,789 | B1 | 7/2001 | Pandey et al. |
| 6,280,289 | B1 | 8/2001 | Wiswesser et al. |
| 6,315,635 | B1 | 11/2001 | Lin |
| 6,399,501 | B2 | 6/2002 | Birang et al. |
| 6,422,927 | B1 | 7/2002 | Zuniga |
| 6,461,980 | B1 | 10/2002 | Cheung et al. |
| 6,494,765 | B2 | 12/2002 | Gitis et al. |
| 6,543,251 | B1 | 4/2003 | Gasteyer, III et al. |
| 6,640,151 | B1 | 10/2003 | Somekh et al. |
| 6,647,309 | B1 | 11/2003 | Bone |
| 6,776,692 | B1 | 8/2004 | Zuniga et al. |
| 6,829,559 | B2 | 12/2004 | Bultman et al. |
| 7,008,295 | B2 | 3/2006 | Wiswesser et al. |
| 7,016,750 | B2 | 3/2006 | Steinkirchner et al. |
| 7,196,782 | B2 | 3/2007 | Fielden et al. |
| 7,334,588 | B2 * | 2/2008 | Verhaverbeke ........... B08B 3/12 134/147 |
| 7,748,648 | B2 | 7/2010 | Songbe et al. |
| 9,005,999 | B2 | 4/2015 | Xu et al. |
| 9,233,448 | B2 | 1/2016 | Motoshima et al. |
| 9,475,167 | B2 | 10/2016 | Maruyama et al. |
| 9,579,768 | B2 | 2/2017 | Motoshima et al. |
| 9,630,295 | B2 | 4/2017 | Peng et al. |
| 9,687,960 | B2 | 6/2017 | Butterfield et al. |
| 9,782,870 | B2 | 10/2017 | Maruyama et al. |
| 10,035,238 | B2 | 7/2018 | Maruyama et al. |
| 11,577,358 | B2 * | 2/2023 | Kumar .................... B24B 37/34 |
| 2001/0055940 | A1 | 12/2001 | Swanson |
| 2002/0039874 | A1 | 4/2002 | Hecker et al. |
| 2002/0058469 | A1 | 5/2002 | Pinheiro et al. |
| 2003/0055526 | A1 | 3/2003 | Avanzino et al. |
| 2003/0211816 | A1 | 11/2003 | Liu et al. |
| 2005/0024047 | A1 | 2/2005 | Miller et al. |
| 2005/0042877 | A1 | 2/2005 | Salfelder et al. |
| 2005/0211377 | A1 | 9/2005 | Chen et al. |
| 2007/0238395 | A1 | 10/2007 | Kimura et al. |
| 2009/0258573 | A1 | 10/2009 | Muldowney et al. |
| 2010/0047424 | A1 | 2/2010 | Cousin et al. |
| 2010/0081360 | A1 | 4/2010 | Xu et al. |
| 2010/0227435 | A1 | 9/2010 | Park et al. |
| 2010/0279435 | A1 | 11/2010 | Xu et al. |
| 2010/0291841 | A1 | 11/2010 | Sung et al. |
| 2011/0159782 | A1 | 6/2011 | Sone et al. |
| 2012/0002338 | A1 | 1/2012 | Smith et al. |
| 2012/0034846 | A1 | 2/2012 | Minamihaba et al. |
| 2012/0040592 | A1 | 2/2012 | Chen et al. |
| 2012/0190273 | A1 | 7/2012 | Ono et al. |
| 2013/0023186 | A1 * | 1/2013 | Motoshima ............. B24B 49/14 451/36 |
| 2013/0045596 | A1 | 2/2013 | Eda et al. |
| 2013/0115855 | A1 | 5/2013 | Kodera et al. |
| 2013/0283852 | A1 | 10/2013 | Sipocz et al. |
| 2014/0187122 | A1 | 7/2014 | Ishibashi |
| 2015/0196988 | A1 | 7/2015 | Watanabe |
| 2015/0224621 | A1 | 8/2015 | Motoshima et al. |
| 2015/0224623 | A1 | 8/2015 | Xu et al. |
| 2017/0232572 | A1 | 8/2017 | Brown |
| 2018/0236631 | A1 | 8/2018 | Eto et al. |
| 2019/0143476 | A1 | 5/2019 | Wu |
| 2019/0287866 | A1 | 9/2019 | Izumi et al. |
| 2020/0001426 | A1 | 1/2020 | Soundararajan et al. |
| 2020/0001427 | A1 | 1/2020 | Soundararajan et al. |
| 2020/0262024 | A1 | 8/2020 | Chang et al. |
| 2020/0331113 | A1 | 10/2020 | Soundararajan et al. |
| 2021/0402552 | A1 | 12/2021 | Kumar et al. |

FOREIGN PATENT DOCUMENTS

| | | |
|---|---|---|
| CN | 107078045 | 8/2017 |
| CN | 207171777 | 4/2018 |
| EP | 1108954 | 6/2001 |
| EP | 2478999 | 7/2012 |
| JP | H9-150080 | 6/1997 |
| JP | H11-033897 | 2/1999 |
| JP | 2003-197586 | 7/2003 |
| JP | 2004-202666 | 7/2004 |
| JP | 2004-306173 | 11/2004 |
| JP | 2005-311246 | 11/2005 |
| JP | 2009-82824 | 4/2009 |
| JP | 2010-272635 | 12/2010 |
| JP | 2013-042066 | 2/2013 |
| JP | 2013-99814 | 5/2013 |
| JP | 2016-33239 | 3/2016 |
| JP | 2018-30181 | 3/2018 |
| KR | 10-2009-0046468 | 5/2009 |
| KR | 10-2012-0084671 | 7/2012 |
| KR | 10-2020-0056015 | 5/2020 |
| TW | 202000368 | 1/2020 |
| WO | WO 2002/017411 | 2/2002 |
| WO | WO 2014/113220 | 7/2014 |
| WO | WO 2020/264143 | 12/2020 |

OTHER PUBLICATIONS

Notice of Allowance in Chinese Appln. No. 202180015826.3, dated Jun. 24, 2024, 8 pages (with English translation).
Banerjee et al., "Post CMP Aqueous and CO2 Cryogenic Cleaning Technologies for Low k and Copper Integration," CMPUG Symposium, Poster Abstract, Jan. 2015, 2 pages.
International Search Report and Written Opinion in International Appln. No. PCT/US2021/039449, dated Oct. 19, 2021, 10 pages.
Sampurno et al., "Pad Surface Thermal Management during Copper Chemical Mechanical Planarization" Presented. Oct. 1, 2015 at Iie International Conference on Planarization/CMP Technology, 2015, Sep. 30-Oct. 2, 2015, Session D-4, Chandler, AZ, USA, 24 pages.
Search Report in Taiwanese Appln. No. 110123996, dated Aug. 9, 2022, 3 pages (with English translation).

(56) References Cited

OTHER PUBLICATIONS

Wu et al., "Pad Surface Thermal Management during Copper Chemical: Mechanical Planarization" ECS Journal of Solid State Science and Technology, Apr. 2015, 4(7):P206-12.
Office Action in Japanese Appln. No. 2022-544272, dated Oct. 17, 2023, 11 pages (with English translation).

* cited by examiner

GAS ENTRAINMENT DURING JETTING OF FLUID FOR TEMPERATURE CONTROL IN CHEMICAL MECHANICAL POLISHING

CROSS-REFERENCE TO RELATED APPLICATIONS

This application is a continuation of U.S. patent application Ser. No. 16/932,615, filed Jul. 17, 2020, which claims priority to U.S. Provisional Application Ser. No. 63/046,414, filed on Jun. 30, 2020, the disclosures of which are incorporated by reference.

TECHNICAL FIELD

The present disclosure relates to temperature control during chemical mechanical polishing (CMP), and more particularly to cooling of a polishing pad during CMP.

BACKGROUND

An integrated circuit is typically formed on a substrate by the sequential deposition of conductive, semiconductive, or insulative layers on a semiconductor wafer. A variety of fabrication processes require planarization of a layer on the substrate. For example, one fabrication step involves depositing a filler layer over a non-planar surface and polishing the filler layer until the top surface of a patterned layer is exposed. As another example, a layer can be deposited over a patterned conductive layer and planarized to enable subsequent photolithographic steps.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing slurry with abrasive particles is typically supplied to the surface of the polishing pad.

The polishing rate in the polishing process can be sensitive to temperature. Various techniques to control temperature during polishing have been proposed.

SUMMARY

In one aspect, a chemical mechanical polishing system includes a platen to support a polishing pad having a polishing surface, and a pad cooling assembly. The pad cooling assembly has an arm extending over the platen, a nozzle suspended by the arm and coupled to a source of coolant fluid, the nozzle positioned to spray coolant fluid from the source onto the polishing surface of the polishing pad, and an opening in the arm adjacent the nozzle and a passage extending in the arm from the opening, the opening positioned sufficiently close to the nozzle that a flow of coolant fluid from the nozzle entrains air from the opening.

In another aspect, a method of temperature control for a chemical mechanical polishing system includes supporting a nozzle on a support arm, delivering a coolant fluid from a coolant source through the nozzle onto a polishing pad, and entraining air from an opening in the support arm in a flow of coolant fluid from the nozzle.

Possible advantages may include, but are not limited to, one or more of the following.

The temperature of a polishing pad can be lowered more efficiently than by just directing coolant onto polishing pad and without requiring more energy. Polishing pad temperature, and thus polishing process temperature, can be controlled and be more uniform on a wafer-to-wafer basis, reducing wafer-to-wafer non-uniformity (WIWNU). The temperature of the polishing pad surface can be lowered during one or more of the metal clearing, over-polishing, or conditioning steps of a polishing operation. This can reduce dishing and corrosion, and/or improve uniformity of pad asperity, thus improving polishing uniformity and extending the lifetime of the pad.

The details of one or more implementations are set forth in the accompanying drawings and the description below. Other aspects, features, and advantages will be apparent from the description and drawings, and from the claims.

DETAILED DESCRIPTION

Chemical mechanical polishing operates by a combination of mechanical abrasion and chemical etching at the interface between the substrate, polishing liquid, and polishing pad. During the polishing process, a significant amount of heat is generated due to friction between the surface of the substrate and the polishing pad. In addition, some processes also include an in-situ pad conditioning step in which a conditioning disk, e.g., a disk coated with abrasive diamond particles, is pressed against the rotating polishing pad to condition and texture the polishing pad surface. The abrasion of the conditioning process can also generate heat. For example, in a typical one minute copper CMP process with a nominal downforce pressure of 2 psi and removal rate of 8000 Å/min, the surface temperature of a polyurethane polishing pad can rise by about 30° C.

Both the chemical-related variables in a CMP process, e.g., as the initiation and rates of the participating reactions, and the mechanical-related variables, e.g., the surface friction coefficient and viscoelasticity of the polishing pad, are strongly temperature dependent. Consequently, variation in the surface temperature of the polishing pad can result in changes in removal rate, polishing uniformity, erosion, dishing, and residue. By more tightly controlling the temperature of the surface of the polishing pad during polishing, variation in temperature can be reduced, and polishing performance, e.g., as measured by within-wafer non-uniformity or wafer-to-wafer non-uniformity, can be improved.

One technique that has been proposed to control the temperature of the chemical mechanical polishing process is to spray a coolant, e.g., cold water, onto the polishing pad. Power is required to lower the temperature of the coolant, and heat can be transfers to the coolant as it flows from a source to a dispensing port. However, by positioning the nozzle that sprays the coolant onto the polishing pad near an opening, some air can be entrained in the flow of the coolant to provide a gas cooling effect, thus magnifying the cooling capability of the cooling system. This can improve efficiency of cooling of the polishing pad. In particular, where the nozzle that sprays the coolant is supported by a support plate of an arm, the air that is entrained can flow from above the support plate, e.g., above the arm. This air should be colder than air adjacent the polishing pad and which may have absorbed heat radiated from the polishing pad.

Figure 1A:
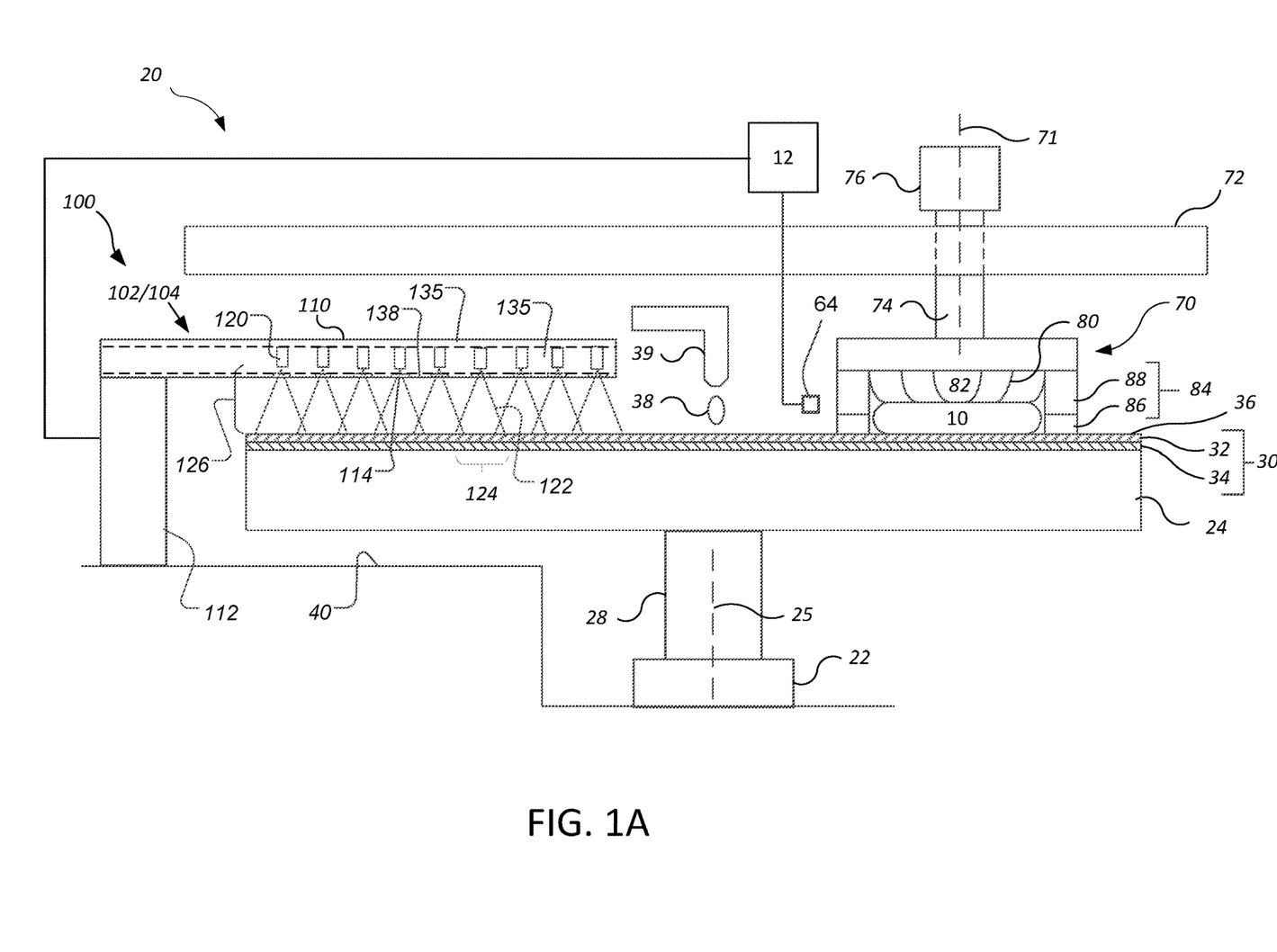
FIG. 1A is a schematic cross-sectional view of an example of a polishing station of the polishing apparatus.
Figure 1B:
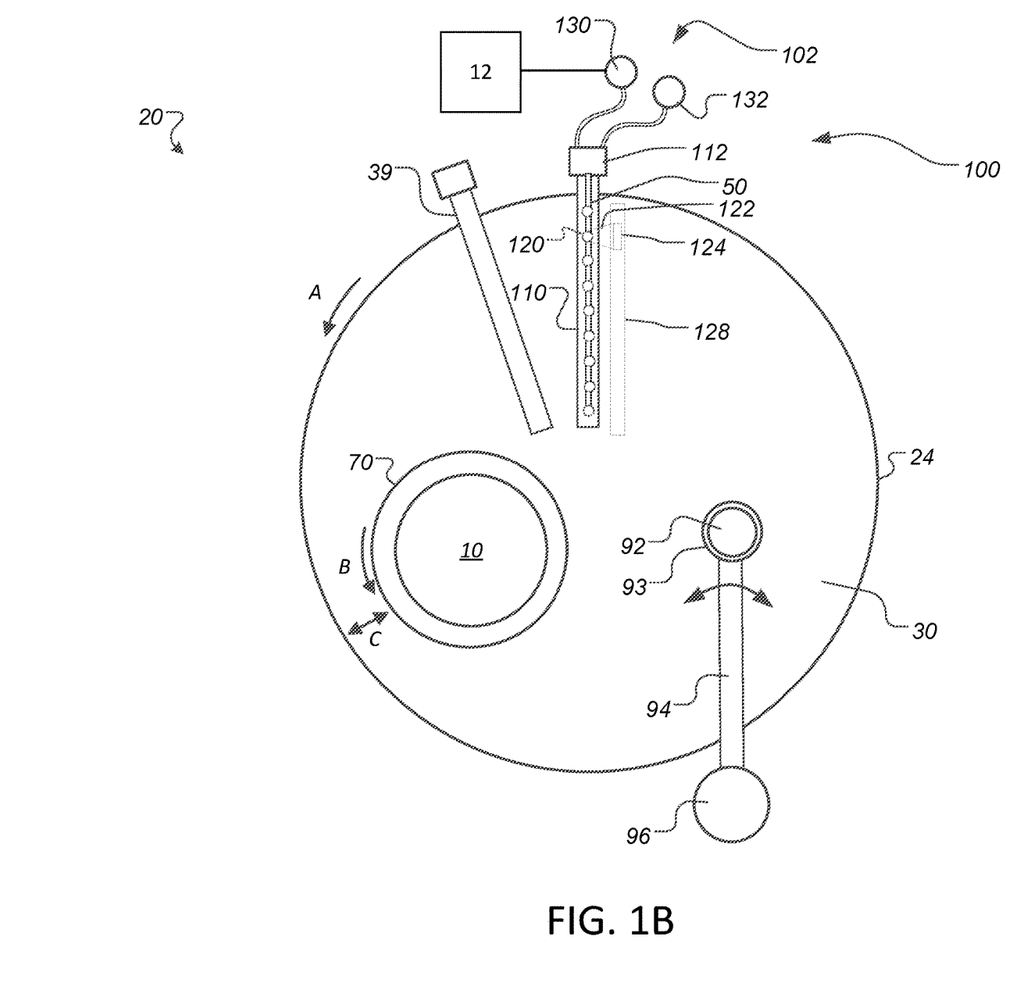
FIG. 1B is a schematic top view of an example polishing station of the chemical mechanical polishing apparatus.

FIGS. 1A and 1B illustrate an example of a polishing station 20 of a chemical mechanical polishing system. The polishing station 20 includes a rotatable disk-shaped platen 24 on which a polishing pad 30 is situated. The platen 24 is operable to rotate (see arrow A in FIG. 1B) about an axis 25. For example, a motor 22 can turn a drive shaft 28 to rotate the platen 24. The polishing pad 30 can be a two-layer polishing pad with an outer polishing layer 34 and a softer backing layer 32.

The polishing station 20 can include a supply port, e.g., at the end of a slurry supply arm 39, to dispense a polishing liquid 38, such as an abrasive slurry, onto the polishing pad 30. The polishing station 20 can also include a pad conditioner with a conditioner disk to maintain the surface roughness of the polishing pad 30.

A carrier head 70 is operable to hold a substrate 10 against the polishing pad 30. The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel, by movement along the track, or by rotational oscillation of the carousel itself.

The carrier head 70 can include a flexible membrane 80 having a substrate mounting surface to contact the back side of the substrate 10, and a plurality of pressurizable chambers 82 to apply different pressures to different zones, e.g., different radial zones, on the substrate 10. The carrier head 70 can include a retaining ring 84 to hold the substrate. In some implementations, the retaining ring 84 may include a lower plastic portion 86 that contacts the polishing pad, and an upper portion 88 of a harder material, e.g., a metal.

In operation, the platen is rotated about its central axis 25, and the carrier head is rotated about its central axis 71 (see arrow B in FIG. 1B) and translated laterally (see arrow C in FIG. 1B) across the top surface of the polishing pad 30.

In some implementations, the polishing station 20 includes a temperature sensor 64 to monitor a temperature in the polishing station or a component of/in the polishing station, e.g., the temperature of the polishing pad 30 and/or slurry 38 on the polishing pad. For example, the temperature sensor 64 could be an infrared (IR) sensor, e.g., an IR camera, positioned above the polishing pad 30 and configured to measure the temperature of the polishing pad 30 and/or slurry 38 on the polishing pad. In particular, the temperature sensor 64 can be configured to measure the temperature at multiple points along the radius of the polishing pad 30 in order to generate a radial temperature profile. For example, the IR camera can have a field of view that spans the radius of the polishing pad 30.

In some implementations, the temperature sensor is a contact sensor rather than a non-contact sensor. For example, the temperature sensor 64 can be thermocouple or IR thermometer positioned on or in the platen 24. In addition, the temperature sensor 64 can be in direct contact with the polishing pad.

In some implementations, multiple temperature sensors could be spaced at different radial positions across the polishing pad 30 in order to provide the temperature at multiple points along the radius of the polishing pad 30. This technique could be used in the alternative or in addition to an IR camera.

Although illustrated in FIG. 1A as positioned to monitor the temperature of the polishing pad 30 and/or slurry 38 on the pad 30, the temperature sensor 64 could be positioned inside the carrier head 70 to measure the temperature of the substrate 10. The temperature sensor 64 can be in direct contact (i.e., a contacting sensor) with the semiconductor wafer of the substrate 10. In some implementations, multiple temperature sensors are included in the polishing station 22, e.g., to measure temperatures of different components of/in the polishing station.

The polishing system 20 also includes a temperature control system 100 to control the temperature of the polishing pad 30 and/or slurry 38 on the polishing pad. The temperature control system 100 can include a cooling system 102. The cooling system 102 operates by delivering a coolant onto the polishing surface 36 of the polishing pad 30 (or onto a polishing liquid that is already present on the polishing pad).

The coolant can be a gas, e.g., air, and/or a liquid, e.g., water. The gaseous component of the coolant, if present, can be air or another gas that is inert to the polishing process, such as nitrogen, carbon dioxide, argon, or another noble gas, or mixture thereof. The liquid component of the coolant, if present, can be water or another liquid such as ethanol, or isopropyl alcohol, or a mixture of thereof. The liquid component can be inert to the polishing process. The coolant can be at room temperature or chilled below room temperature, i.e., below 20° C. For example, the coolant can be at 5-15° C. In some implementations, the coolant is at or below 0° C.

In some implementations, the coolant is substantially pure gas. In some implementations, the coolant is a spray of gas and liquid, e.g., an aerosolized spray of liquid, such as water in a gas carrier, such as air. In some implementations, the cooling system can have nozzles that generate an aerosolized spray of water that is chilled below room temperature.

In some implementations, the coolant includes particles of solid material mixed with the gas and/or liquid. The solid material can be a chilled material, e.g., ice, dry ice, or frozen ethanol or isopropyl alcohol. In some implementations, the coolant is a spray of gas, e.g., air, and solid particles, e.g., ice particles, but substantially without liquid phase. The solid material can also be a material that absorbs heat by chemical reaction when dissolved in water.

The coolant can be delivered by flowing through one or more apertures, e.g., holes or slots, optionally formed in nozzles, in a coolant delivery arm. The apertures can be provided by a manifold that is connected to a coolant source.

As shown in FIGS. 1A and 1B, an example cooling system 102 includes an arm 110 that extends over the platen 24 and polishing pad 30 from an edge of the polishing pad to or at least near (e.g., within 5% of the total radius of the polishing pad) the center of polishing pad 30. The arm 110 can be supported by a base 112, and the base 112 can be supported on the same frame 40 as the platen 24. The base 112 can include one or more actuators, e.g., a linear actuator to raise or lower the arm 110, and/or a rotational actuator to swing the arm 110 laterally over the platen 24. The arm 110 is positioned to avoid colliding with other hardware components such as the polishing head 70, pad conditioning disk 92, and the slurry dispenser 39.

The example cooling system 102 includes multiple nozzles 120 suspended on the arm 110. Each nozzle 120 is configured to spray a liquid coolant, e.g., water, onto the polishing pad 30. Fluidic connection between a coolant source and the nozzles can be provided by tubing, pipes, etc., outside the arm, e.g., on the top of the arm, and/or within the arm. The arm 110 can be supported by a base 112 so that the nozzles 120 are separated from the polishing pad 30 by a gap 126.

Each nozzle 120 can be configured to start and stop fluid flow through each nozzle 120, e.g., using the controller 12. Each nozzle 120 can be configured to direct aerosolized water in a spray 122 toward the polishing pad 30.

The cooling system 102 can include a source of coolant, which can be a liquid, a gas, or a combination of liquid and gas. The source can include a source 130 for liquid coolant and/or a source 132 for gas coolant (see FIG. 1B). Liquid from the source 130 and gas from the source 132 can be mixed in a mixing chamber, in or on the arm 110, before being directed through the nozzle 120 to form the spray 122. When dispensed, this coolant can be below room temperature, e.g., from −100 to 20° C., e.g., below 0° C.

The coolants used in the cooling system 102 can include, for example, chilled water, liquid nitrogen, liquid ethanol or isopropyl alcohol, gas formed by evaporation of one or more of liquid nitrogen, ethanol or isopropyl alcohol, or dry ice. In some implementations, droplets of water can be added to a gas flow. The water can be cooled to form ice droplets that efficiently cool the polishing pad due to the latent heat of fusion of the ice droplets. Additionally, the ice or water droplets can prevent the polishing pad 30 from drying out as it is being cooled by the cooled gas. Rather than water, ethanol or isopropyl alcohol can be injected into the gas flow to form frozen particles.

Gas, e.g., compressed gas, from the gas source 132 can be connected to a vortex tube 50 that can separate the compressed gas into a cold stream and a hot stream, and direct the cold stream to the nozzles 120 onto the polishing pad 30. In some implementations, the nozzles 120 are the lower ends of vortex tubes that direct a cold stream of compressed gas onto the polishing pad 30.

In some implementations, a process parameter, e.g., flow rate, pressure, temperature, and/or mixing ratio of liquid to gas, can be independently controlled for each nozzle (e.g., by the controller 12). For example, the coolant for each nozzle 120 can flow through an independently controllable chiller to independently control the temperature of the spray. As another example, a separate pair of pumps, one for the gas and one for the liquid, can be connected to each nozzle such that the flow rate, pressure and mixing ratio of the gas and liquid can be independently controlled for each nozzle.

The various nozzles can spray onto different radial zones 124 on the polishing pad 30. Adjacent radial zones 124 can overlap. In some implementations, the nozzles 120 generate a spray that impinges the polishing pad 30 along an elongated region 128. For example, the nozzle can be configured to generate a spray in a generally planar triangular volume.

One or more of the elongated regions 128, e.g., all of the elongated regions 128, can have a longitudinal axis parallel to the radius that extends through the region 128 (see region 128a). Alternatively, the nozzles 120 generate a conical spray.

Although FIG. 1A illustrates the spray itself overlapping, the nozzles 120 can be oriented so that the elongated regions do not overlap. For example, at least some nozzles 120, e.g., all of the nozzles 120, can be oriented so that the elongated region 128 is at an oblique angle relative to the radius that passes through the elongated region (see region 128b).

At least some nozzles 120 can be oriented so that a central axis of the spray (see arrow A) from that nozzle is at an oblique angle relative to the polishing surface 36. In particular, spray 122 can be directed from a nozzle 120 to have a horizontal component in a direction opposite to the direction of motion of polishing pad 30 (see arrow A) in the region of impingement caused by rotation of the platen 24.

Although FIGS. 1A and 1B illustrate the nozzles 120 as spaced at uniform intervals, this is not required. The nozzles 120 could be distributed non-uniformly either radially, or angularly, or both. For example, the nozzles 120 can clustered more densely along the radial direction toward the edge of the polishing pad 30. In addition, although FIGS. 1A and 1B illustrate nine nozzles, there could be a larger or smaller number of nozzles, e.g., three to twenty nozzles.

The cooling system 102 can be used to lower the temperature of the polishing surface 36. For example, the temperature of the polishing surface 36 can be lowered using liquid from the liquid coolant 130 via the spray 122, gas from the gas coolant 132 via the spray 122, the cold stream 52 from the vortex tube 50 (see FIG. 5), or a combination thereof. In some embodiments, the temperature of the polishing surface 36 can be lowered to at or below 20° C. Lower temperatures during one or more of metal clearing, over-polishing or conditioning steps can reduce dishing and erosion of the soft metals during CMP by reducing the selectivity of the polishing liquid 38.

In some implementations, a temperature sensor measures the temperature of the polishing pad 30 or polishing liquid 38 on the polishing pad 30, and a controller 12 executes a closed loop control algorithm to control the flow rate of the coolant relative to the flow rate of the polishing liquid 38 so as to maintain the polishing pad 30 or polishing liquid 38 on the polishing 30 pad at a desired temperature.

Lower temperatures during CMP can be used to reduce corrosion. For example, lower temperatures during one or more of metal clearing, over-polishing, or conditioning steps could reduce galvanic corrosion in the various components, as galvanic reactions can be temperature-dependent. Additionally, during CMP inert gases can be used in the polishing process. In particular, a gas that lacks oxygen (or has lower oxygen than normal atmosphere) can be used to create a localized inert environment that reduces the oxygen in the localized inert environment, which can result in reduced corrosion. Examples of such gasses include nitrogen and carbon dioxide, e.g., evaporated from liquid nitrogen or dry ice.

Lowering the temperature of the polishing surface 36, e.g., for the conditioning step, can increase the storage modulus of the polishing pad 30 and reduce the viscoelasticity of the polishing pad 30. The increased storage modulus and reduced viscoelasticity, combined with a lower downforce on the pad conditioning disk 92 and/or less aggressive conditioning by the pad conditioning disk 92, can result in a more uniform pad asperity. An advantage to the uniform pad asperity is to reduce scratches on the substrate 10 during subsequent polishing operations, as well as increase the lifespan of the polishing pad 30.

Figure 5:
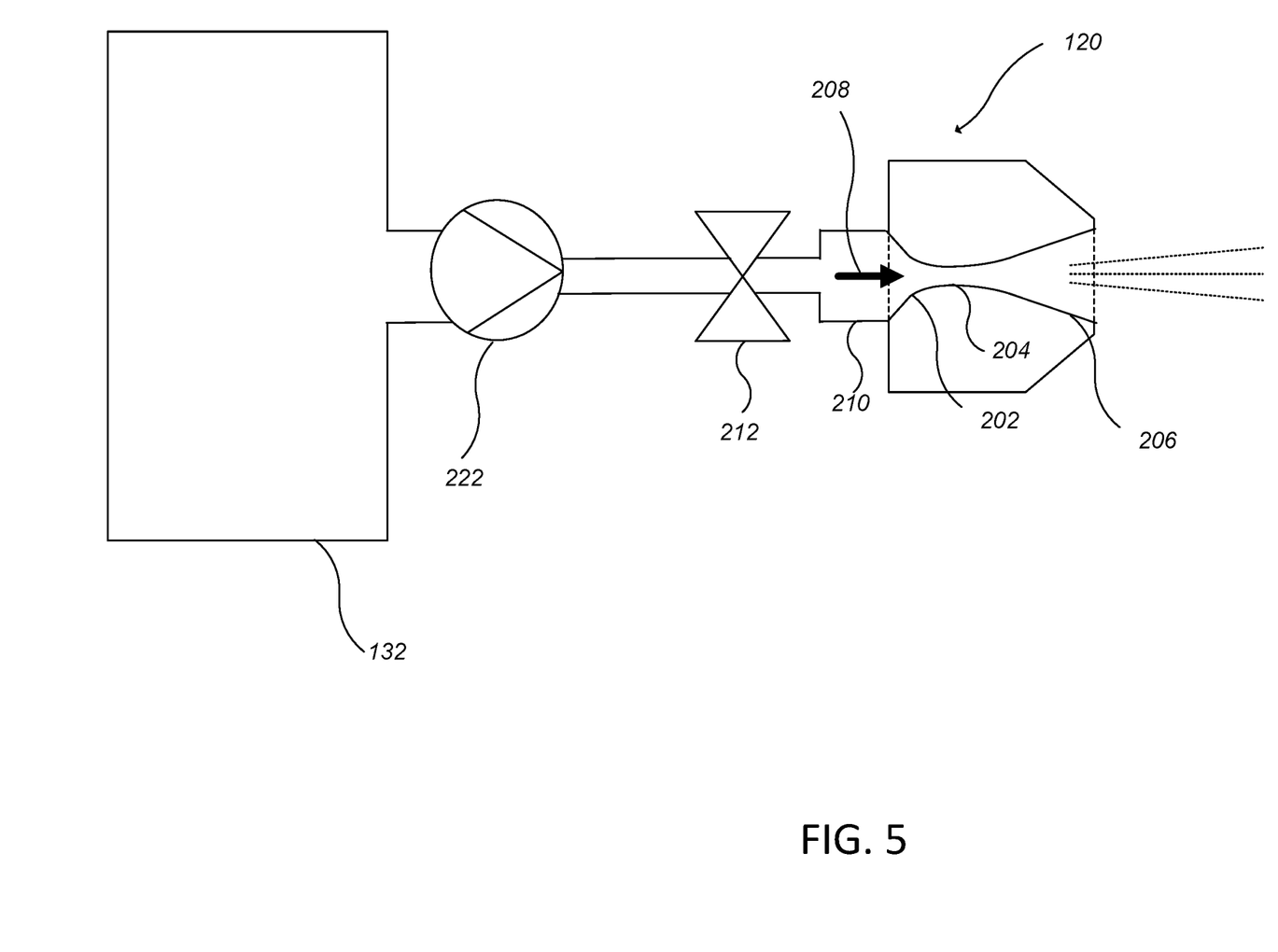
FIG. 5 is a schematic view of a coolant delivery system.

As shown in FIG. 5, each nozzle 120 can be a convergent-divergent (CD) nozzle. The convergent-divergent (CD) nozzle can also be described as a de Laval nozzle or supersonic nozzle. Each nozzle 120 has a convergent section 202 (e.g., an input port) where gas (e.g., gas from the gas source 132) enters the nozzle 120 at subsonic speeds. A pump 222 can direct gas from the gas source 132 and through a dispenser 210 into the CD nozzle 120. For example, gas entering the convergent section 202 can be at room temperature, e.g., 20-30° C., or below room temperature, and can enter at a rate of 0 to 1000 liters per minute per nozzle, e.g., 500 liters per minute per nozzle. From the convergent section 202, the gas enters a choke-point, or throat 204, where the cross-sectional area of the nozzle 120 is at its minimum. The velocity of the gas increases as it flows from the convergent section 202, through the throat 204 and to the divergent section 206 (e.g., an output port). The throat 204 causes the velocity of the gas flowing through the throat 204 to increase, so when the gas enters and exits the divergent section 206, the velocity of the gas is increased to supersonic speeds. For example, gas exiting the divergent section 206 can be at a temperature below room temperature, e.g., −100 to 20° C., −90 to 0° C., −80 to −25° C., or −70 to −50° C.

The gas used in the cooling system 102 can include, for example, air, nitrogen, carbon dioxide, argon, or evaporated gases such as vaporous ethanol or isopropyl alcohol. The gas can be cooled even before being delivered to the CD nozzle 120. For example, the cooled gas can be cold air (e.g., chilled by passing through a heat exchanger), cold nitrogen gas (e.g., from evaporation from liquid nitrogen), or cold carbon dioxide gas (e.g., from the sublimation of dry ice).

The CD nozzle 120 can be used to cool the polishing pad 30. For example, the divergent section 206 can dispense cooled gas directly onto the polishing pad 30. For example, the outlet from the divergent section 206 can be located about 1 to 10 cm from the polishing surface 36 and the nozzle 120 can be oriented so that the gas flow impinges the polishing surface.

In some implementations, the source 130 of liquid coolant can deliver liquid, e.g., water, through a dispenser 210. The dispenser 210 can be an injector positioned to inject water into the gas flow through the nozzle 120. For example, the injector 210 can be positioned to inject water droplets into the convergent section 202, into the throat 204 (as illustrated in FIG. 5), into the divergent section 206, or directly after the divergent section 206.

The flow rate of the liquid coolant into the gas flow, e.g., into the nozzle 120, can be controlled by a valve 212. The dispenser 210 can dispense water droplets 208, e.g., at a rate of 0 to 300 milliliters per minute, e.g., 3 to 50 milliliters per minute. The liquid flow rate can be about 0.001% to 1%, e.g., 0.01 to 0.1% of the gas flow rate. As gas flows through the CD nozzle 120, the water droplets 208 can be cooled by the gas as the gas flowing through the CD nozzle 120 are cooled. In some implementations, the water droplets 208 are cooled to form ice droplets. The ice droplets can be uniform in size, e.g., roughly 10 µm in diameter.

In some implementations, the water droplets 208 are also dispensed directly onto the polishing pad 30, which alongside the cooled gas, can further cool the polishing pad 30. Additionally, the ice or water droplets can prevent the polishing pad 30 from drying out as it is being cooled by the cooled gas. In some implementations, the cooled gas freezes the water droplets 208 to form ice droplets, which along with the cooled gas, can cool the polishing pad 30. The ice droplets can efficiently cool the polishing pad 30, as the latent heat of fusion can cool the polishing pad 30 as the ice droplets absorb heat and melt into water. Further, the ice droplets can be used to abrade and clean the polishing pad 30.

In some implementations, the coolant is substantially just liquid, e.g., not mixed with a gas.

Figure 2:
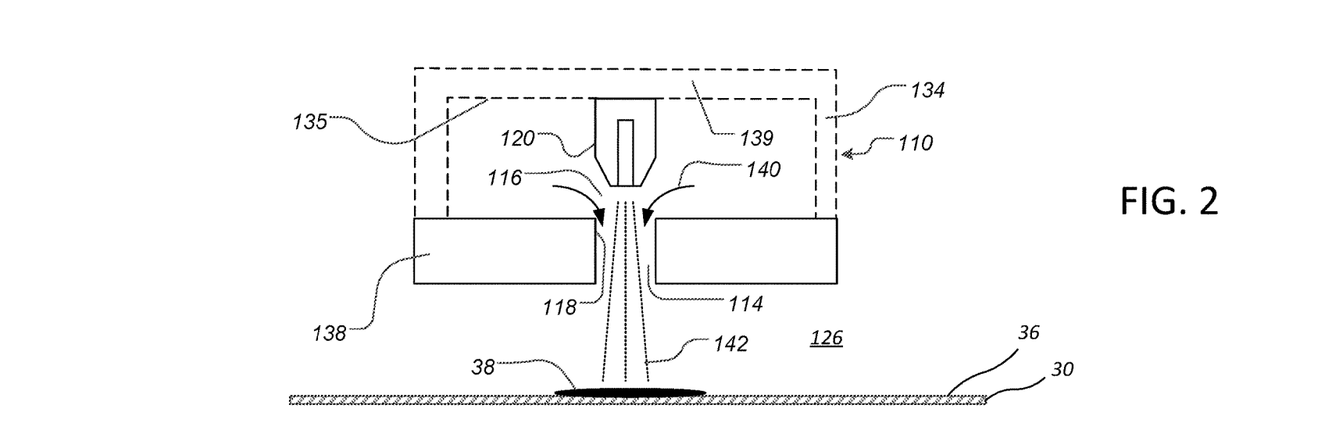
FIG. 2 is a schematic cross-sectional view of a coolant delivery arm.

Referring to FIG. 2, the arm 110 includes a support plate 138, and the nozzles 120 are suspended above the support plate 138. Each nozzle 120 can be positioned above a corresponding passage 114 through the support plate 138. In some implementations, rather than individual passages, there is a slot extending along the support plate 138 and the nozzles 120 are positioned above the slot.

In some implementations, the nozzles 120 are suspended inside the arm 110. For example, the support plate 138 can be covered by a cover 134 to form a chamber 135, the nozzles 120 can be suspended from a ceiling 135 of the cover 134 inside the chamber 135. All of the nozzles 120 can be housed in a common chamber 135 (see FIG. 1A). However, the cover is optional, and the top surface of the support plate 138 can be generally open to the environment with the nozzles 120 similarly not covered. In this case, the nozzles 120 could be suspended by struts or a framework extending from the support plate 138.

Although FIGS. 1A and 2 illustrate the nozzles 120 positioned entirely above the top surface of the support plate 138, this is not necessary. For example, each nozzle 120 could extend partially into a corresponding passage 114 in the support plate 138. However, the bottom of the nozzle 120 does not protrude below the bottom surface of the support plate 138.

The nozzles 120 are separated from the polishing pad 30 by the gap 126. The nozzles 120 spray the liquid coolant with the entrained gas through the passage 114 in the support plate 138 onto the polishing pad 30. Each nozzle 120 can have a separate passage 114. Although the passage 114 are illustrated as circular (in a top view of the arm), the passages can have other cross-sectional shapes, e.g., rectangular, oval, etc.

The space between an inner surface 118 of the passage 114 and the outer surface of the nozzle 120 provides an air gap 116. The air gap can be about 5-10 mm wide. The air gap 116 serves as an opening to allow additional air, shown by arrows 140, to become entrained in the coolant fluid flow 142. The air entrained in the coolant fluid flow 142 can increase the total gas and coolant flow mixture directed onto the slurry 38 on the top surface 36 of the polishing pad 30, thus increasing the heat transfer from the slurry 38 and the polishing pad 30. As shown, the air that is entrained flows from above the support plate 138. Simply increasing the gas flow rate can also improve the heat transfer. However, without being limited to any particular theory, air from the above the support plate 138 can be cooler than air directly above the polishing pad that may have absorbed heat from the polishing pad, so as to also improve the heat transfer.

Figure 3A:
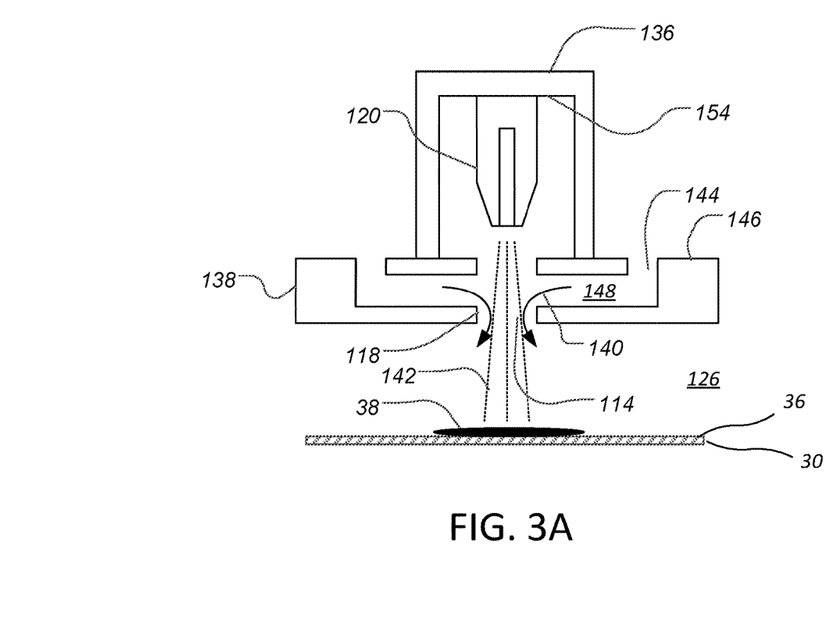
FIGS. 3A and 3B is a schematic cross-sectional and top views, respectively, of another implementation of a coolant delivery arm.
Figure 3B:
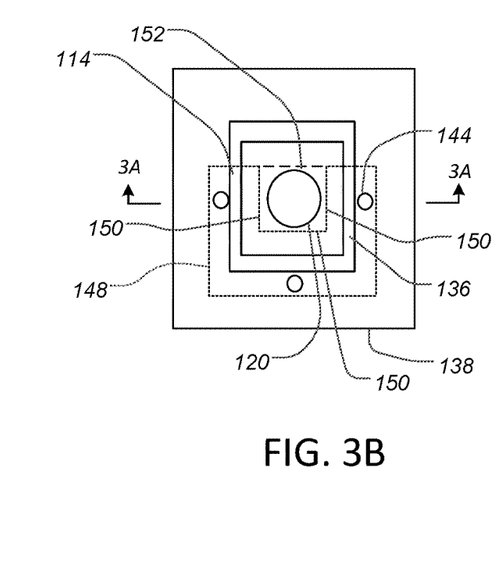

Referring to FIGS. 3A and 3B, in some implementations, the nozzles 120 are suspended on the arm 110 inside a housing 136. The arm 110 can be configured as discussed above, except as noted below. All of the nozzles 120 can be located inside a common chamber of a single housing 136. Alternatively, as shown in FIG. 3B, at least one of the nozzles 120, e.g., every nozzle 120, can have a dedicated housing 136 so there is a single nozzle 120 in the chamber provided by a housing 136. Each nozzle is suspended above the support plate 138, e.g., from the ceiling 154 of the housing 136. In some implementations, a passage through the housing 136 connects an interior of the housing to external atmosphere.

A top surface 146 of the support plate 138 can have an aperture 144. The aperture 144 connects to an air plenum 148 formed in the body of the support plate 138. In particular, the plenum 148 can surround and connect to three sides of the passage 114. Thus, the passage 114 has openings on three sides 150 to the plenum 148 to allow air flow 140, and is closed on one side 152.

The nozzles 120 spray the liquid coolant through a passage 114 in the support plate 138. Although air flow through the housing 136 is generally blocked, air can enter the plenum through the aperture 144. Thus, the plenum 148 provides an opening through which air can flow into the passage 114 to be entrained in the spray from the nozzles 120. Thus, this configuration can also increase total gas and coolant flow mixture directed onto the slurry 38 on the polishing pad 30, thus increasing the heat transfer from the slurry 38 and the polishing pad 30. Because the aperture 144 is in the top surface of the support plate 138, the air that is entrained flows from above the support plate 138. However, this configuration may not be as efficient when compared to the configuration of FIG. 2.

Figure 4A:
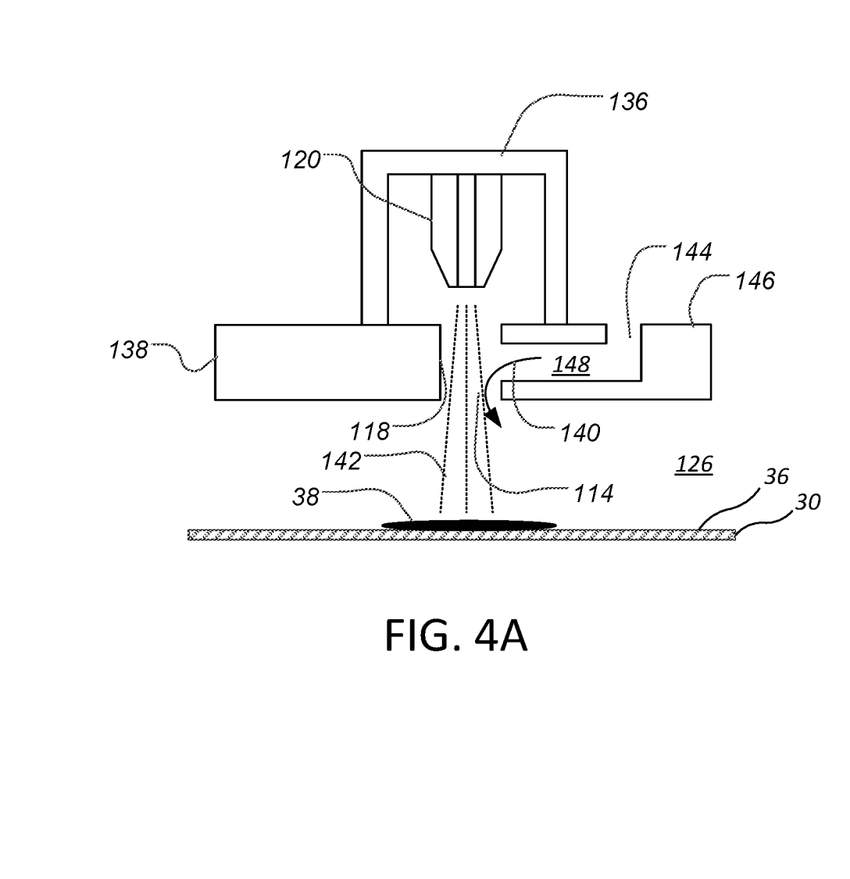
FIGS. 4A and 4B are schematic cross-sectional and top views, respectively, of a further implementation of a coolant delivery arm.
Figure 4B:
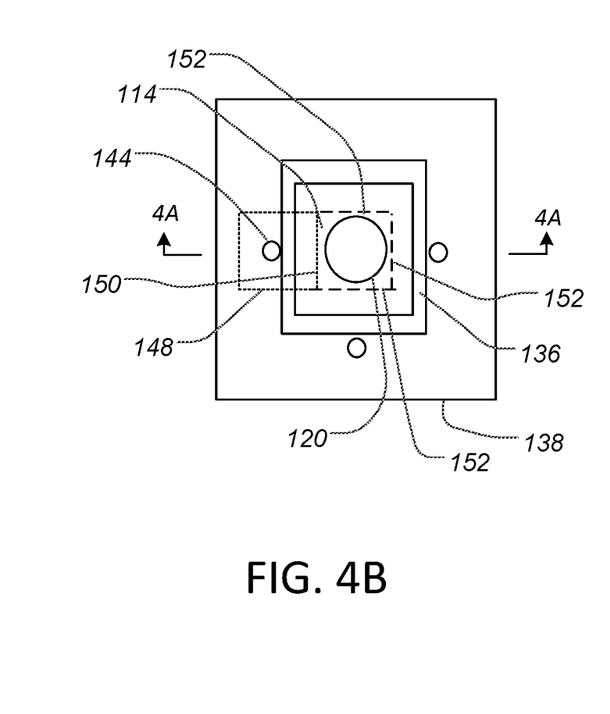

FIGS. 4A and 4B illustrate a configuration that is similar to the configuration shown in FIGS. 3A and 3B, but the passage 114 is open on only one side 150 to the plenum 148. Again, the plenum 148 provides an opening through which air can flow into the passage 114 to be entrained in the spray from the nozzles 120, resulting in increased total gas and coolant flow onto the slurry 38 on the polishing pad 30. However, this configuration may not be as efficient when compared to the configuration of FIGS. 3A and 3B.

The polishing system 20 can also include a heating system, e.g., an arm with apertures to dispense a heated fluid, e.g., steam, onto the polishing pad, a high pressure rinsing system, e.g., an arm with nozzles to spray a rinsing liquid onto the polishing pad, and a wiper blade or body to evenly distribute the polishing liquid 38 across the polishing pad 30.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. The polishing layer can be a standard (for example, polyurethane with or without fillers) polishing material, a soft material, or a fixed-abrasive material.

Terms of relative positioning are used to refer to relative positioning within the system or substrate; it should be understood that the polishing surface and substrate can be held in a vertical orientation or some other orientation during the polishing operation.

The polishing system 20 can also include a controller 12 to control operation of various components, e.g., the temperature control system 100. The controller 12 is configured to receive the temperature measurements from the temperature sensor 64 for each radial zone of the polishing pad. The controller 12 can compare the measured temperature profile to a desired temperature profile, and generate a feedback signal to a control mechanism (e.g., actuator, power source, pump, valve, etc.) for each nozzle or opening. The feedback signal is calculated by the controller 12, e.g., based on an internal feedback algorithm, to cause the control mechanism to adjust the amount of cooling or heating such that the polishing pad and/or slurry reaches (or at least moves closer to) the desired temperature profile.

Functional operations of the controller 12 can be implemented using one or more computer program products, i.e., one or more computer programs tangibly embodied in a non-transitory computer readable storage media, for execution by, or to control the operation of, data processing apparatus, e.g., a programmable processor, a computer, or multiple processors or computers.

Figure 6:
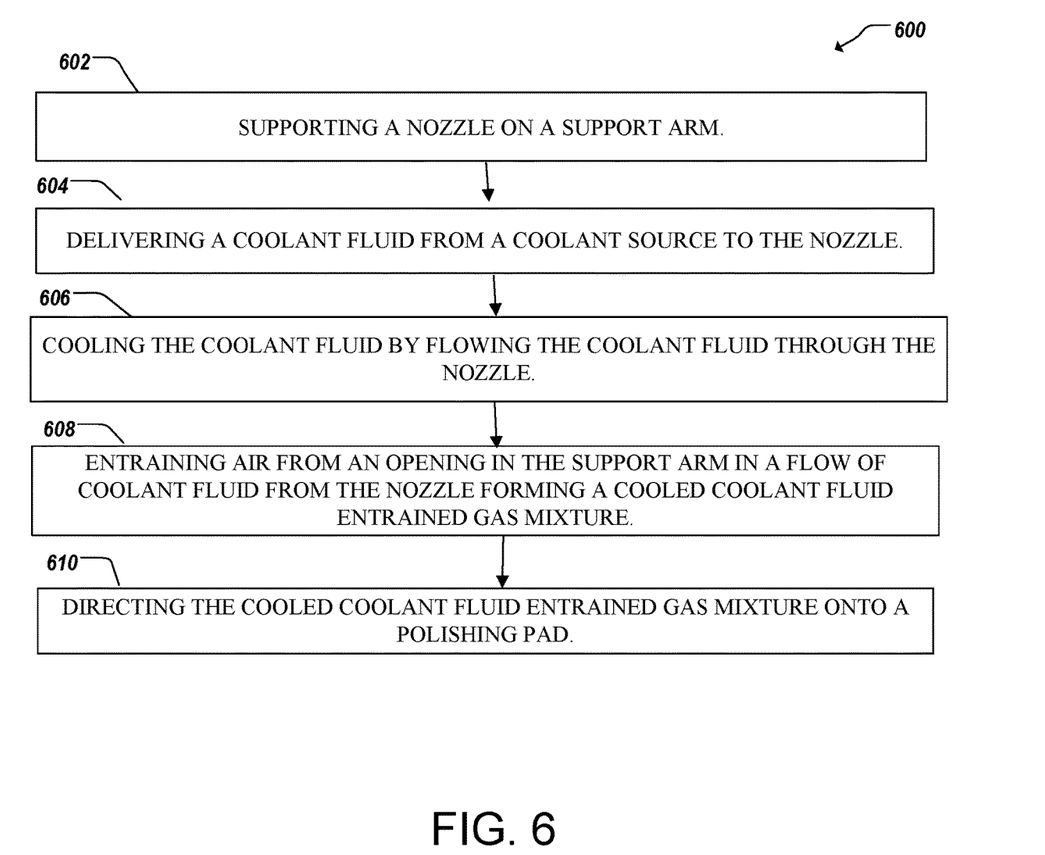
FIG. 6 is a flow chart of an example of a method of controlling the temperature of a chemical mechanical polishing system of FIG. 2.

FIG. 6 shows a flow chart of an example of a method 600 of controlling the temperature of a chemical mechanical polishing system of FIG. 2. A nozzle is supported on a support arm (602). A coolant fluid is delivered from a coolant source to the nozzle (604). The coolant fluid can be a liquid, e.g., liquid water, liquid ethanol, and/or liquid isopropyl alcohol. The coolant fluid can be a gas, e.g., formed by chilling air, by evaporation of liquid nitrogen, by evaporation of liquid ethanol, by evaporation of liquid isopropyl alcohol, and/or by sublimation of dry ice. The coolant fluid is cooled by flowing the coolant fluid through the nozzle (606). The coolant fluid is flowed through the nozzle to reduce the temperature of the coolant fluid. Air from an opening in the support arm is entrained in a flow of cooled coolant fluid from the nozzle forming a cooled coolant fluid entrained gas mixture (608). The cooled coolant fluid entrained gas mixture is directed onto a polishing pad (610). The coolant fluid entrained gas mixture can be dispensed onto the polishing pad at a temperature below 0° C. The coolant fluid entrained gas mixture can be dispensed onto the polishing pad at a temperature between −70 to −50° C.

A number of embodiments of the invention have been described. Nevertheless, it will be understood that various modifications may be made without departing from the spirit and scope of the invention.

For example, although the description above focuses on delivering the coolant onto the polishing pad, the coolant could be delivered onto other components to control the temperature of those components. For example, a coolant could be sprayed onto the substrate while the substrate is positioned in a transfer station, e.g., in a load cup. As another example, the load cup itself could be sprayed with the coolant. As yet another example, the conditioning disk could be sprayed with the coolant.

Although FIG. 1B illustrates the arm 110 as linear, the arm could be arcuate. In addition, various subsystems can be included in a single assembly supported by a common arm. For example, an assembly can include the cooling module, as well as one or more of a rinse module, a heating module, a slurry delivery module, and optionally a wiper module.

Accordingly, other embodiments are within the scope of the following claims.

What is claimed is:

1. A chemical mechanical polishing system, comprising:
   a platen to support a polishing pad having a polishing surface; and
   a pad cooling assembly including
      an arm extending over the platen, wherein the arm comprises a support plate having an aperture therethrough,
      a nozzle supported by the arm above the support plate and coupled to a source of coolant fluid, the nozzle positioned to spray coolant fluid from the source through the aperture onto the polishing surface of the polishing pad, and
      a gap between an inner surface of the aperture and the nozzle such that a flow of coolant fluid from the nozzle entrains air from the gap.

2. The system of claim 1, wherein a portion of the nozzle extends into the aperture.

3. The system of claim 1, wherein a bottom of the nozzle is positioned above the support plate.

4. The system of claim 1, wherein a top of the support plate is uncovered.

5. The system of claim 1, wherein the arm comprises a housing covering the support plate and enclosing the nozzle.

6. The system of claim 1, comprising the source of coolant fluid and the coolant fluid, and wherein the coolant fluid is a liquid.

7. The system of claim 6, wherein the liquid is water, ethanol, and/or isopropyl alcohol.

8. The system of claim 1, comprising the source of coolant fluid and the coolant fluid, and wherein the coolant fluid is a gas.

9. The system of claim 8, wherein the gas is air, nitrogen, carbon dioxide, argon, evaporated ethanol and/or evaporated isopropyl alcohol.

10. The system of claim 1, wherein the nozzle comprises a convergent-divergent nozzle.

11. A chemical mechanical polishing system, comprising:
a platen to support a polishing pad having a polishing surface; and
a pad cooling assembly including
an arm extending over the platen, wherein the arm comprises a support plate having an aperture therethrough,
a nozzle supported by the arm above the support plate and coupled to a source of coolant fluid, the nozzle positioned to spray coolant fluid from the source through the aperture onto the polishing surface of the polishing pad, and
a passage through the support plate from the aperture such that a flow of coolant fluid from the nozzle entrains air from the passage.

12. The system of claim 11, wherein the passage extends laterally through the support plate from at least one side wall of the aperture.

13. The system of claim 12, comprising a plurality of passages extending laterally from a plurality of different side walls of the aperture through the support plate.

14. The system of claim 11, wherein a top of the support plate is uncovered.

15. The system of claim 11, wherein the arm comprises a housing covering the support plate and enclosing the nozzle.

16. The system of claim 11, comprising the coolant source of coolant fluid and the coolant fluid, and wherein the coolant fluid is a liquid.

17. The system of claim 16, wherein the liquid is water, ethanol, and/or isopropyl alcohol.

18. The system of claim 11, comprising the source of coolant fluid and the coolant fluid, and wherein the coolant fluid is a gas.

19. The system of claim 18, wherein the gas is air, nitrogen, carbon dioxide, argon, evaporated ethanol and/or evaporated isopropyl alcohol.

20. The system of claim 11, wherein the nozzle comprises a convergent-divergent nozzle.

* * * * *